(12) United States Patent
Seike et al.

(10) Patent No.: US 11,466,206 B2
(45) Date of Patent: Oct. 11, 2022

(54) SILICON ETCHING SOLUTION AND METHOD FOR PRODUCING SILICON DEVICE USING THE ETCHING SOLUTION

(71) Applicants: Tokuyama Corporation, Yamaguchi (JP); SCREEN Holdings Co., Ltd., Kyoto (JP)

(72) Inventors: Yoshiki Seike, Yamaguchi (JP); Seiji Tono, Yamaguchi (JP); Kenji Kobayashi, Kyoto (JP); Sei Negoro, Kyoto (JP)

(73) Assignees: Tokuyama Corporation, Yamaguchi (JP); SCREEN Holdings Co., Ltd., Kyoto (JP)

(*) Notice: Subject to any disclaimer, the term of this patent is extended or adjusted under 35 U.S.C. 154(b) by 0 days.

(21) Appl. No.: 16/781,013

(22) Filed: Feb. 4, 2020

(65) Prior Publication Data
US 2020/0248076 A1 Aug. 6, 2020

(30) Foreign Application Priority Data

Feb. 5, 2019 (JP) ............................. JP2019-019215
Dec. 6, 2019 (JP) ............................. JP2019-221269

(51) Int. Cl.
*C09K 13/00* (2006.01)
*H01L 21/3213* (2006.01)
*H01L 21/306* (2006.01)

(52) U.S. Cl.
CPC ........ *C09K 13/00* (2013.01); *H01L 21/30604* (2013.01); *H01L 21/32134* (2013.01)

(58) Field of Classification Search
CPC .............. C09K 13/00; H01L 21/32134; H01L 21/30604; H01L 21/30608; C30B 33/10; C30B 29/06
See application file for complete search history.

(56) References Cited

U.S. PATENT DOCUMENTS

| 2006/0016785 | A1 | 1/2006 | Egbe et al. |
| 2008/0026585 | A1* | 1/2008 | Kim ........................ G03F 7/426 438/694 |
| 2010/0126961 | A1 | 5/2010 | Kim et al. |
| 2010/0130016 | A1 | 5/2010 | DeVilliers |

(Continued)

FOREIGN PATENT DOCUMENTS

| CN | 101122026 A | 2/2008 |
| CN | 104119802 A | 10/2014 |

(Continued)

OTHER PUBLICATIONS

English Abstract of JP2006269668 A, Oct. 5, 2006.
(Continued)

*Primary Examiner* — Allan W. Olsen
(74) *Attorney, Agent, or Firm* — Cahn & Samuels, LLP

(57) ABSTRACT

A silicon etching solution includes a mixed solution comprising a quaternary alkylammonium hydroxide and water and further comprises a compound represented by the following formula (1):

$$R^1O-(C_mH_{2m}O)_n-R^2 \qquad (1)$$

wherein $R^1$ is a hydrogen atom or an alkyl group having 1 to 3 carbon atoms, $R^2$ is a hydrogen atom or an alkyl group having 1 to 6 carbon atoms, m is an integer of 2 to 6, and n is 1 or 2.

8 Claims, 3 Drawing Sheets

(56) References Cited

U.S. PATENT DOCUMENTS

| | | | |
|---|---|---|---|
| 2011/0104875 A1* | 5/2011 | Wojtczak | H01L 29/7848 |
| | | | 438/478 |
| 2013/0172224 A1 | 7/2013 | Kumagai et al. | |
| 2017/0145311 A1 | 5/2017 | Liu et al. | |
| 2019/0025702 A1 | 1/2019 | Kamimura et al. | |
| 2019/0085240 A1 | 3/2019 | Liu et al. | |
| 2020/0115105 A1 | 4/2020 | Omatsu et al. | |
| 2020/0157422 A1* | 5/2020 | Liu | H01L 21/32134 |
| 2020/0272056 A1 | 8/2020 | Choi et al. | |
| 2020/0407636 A1* | 12/2020 | Chung | C09K 13/00 |
| 2021/0269716 A1 | 9/2021 | Seike et al. | |

FOREIGN PATENT DOCUMENTS

| | | | | |
|---|---|---|---|---|
| CN | 106935669 A | * | 7/2017 | |
| JP | 2004177740 A | | 6/2004 | |
| JP | 2006008932 A | | 1/2006 | |
| JP | 2006269668 A | | 10/2006 | |
| JP | 2010141139 A | | 6/2010 | |
| JP | 2010278371 A | * | 12/2010 | |
| JP | 2012227304 A | | 11/2012 | |
| JP | 2013251459 A | * | 12/2013 | |
| JP | 2017169834 A1 | | 10/2017 | |
| JP | 2019050364 A | | 3/2019 | |
| TW | 201306120 A | | 2/2013 | |
| TW | 201536896 A | | 10/2015 | |
| TW | 201726895 A | | 8/2017 | |
| WO | WO-2011010739 A1 | * | 1/2011 | B81C 1/00126 |
| WO | WO-2012144461 A1 | * | 10/2012 | C09K 13/02 |

OTHER PUBLICATIONS

English Abstract of JP2010141139 A, Jun. 6, 2010.
English Abstract of JP2012227304 A, Nov. 15, 2012.
English Abstract of WO2017169834 A1, Oct. 5, 2017.
English Abstract for TW201726895 A, Aug. 1, 2017.
English Abstract for TW201306120 A, Feb. 1, 2013.
English Abstract for CN101122026 A, Feb. 13, 2008.
English Abstract for CN104119802 A, Oct. 29, 2014.
English Abstract for JP104119802 A, Jan. 12, 2006.
English Abstract for JP2004177740A, Jun. 24, 2004.
English Abstract for JP2019050364A, Mar. 28, 2019.
English Abstract of TW201536896A, Oct. 1, 2015.

* cited by examiner

[Figure 1]
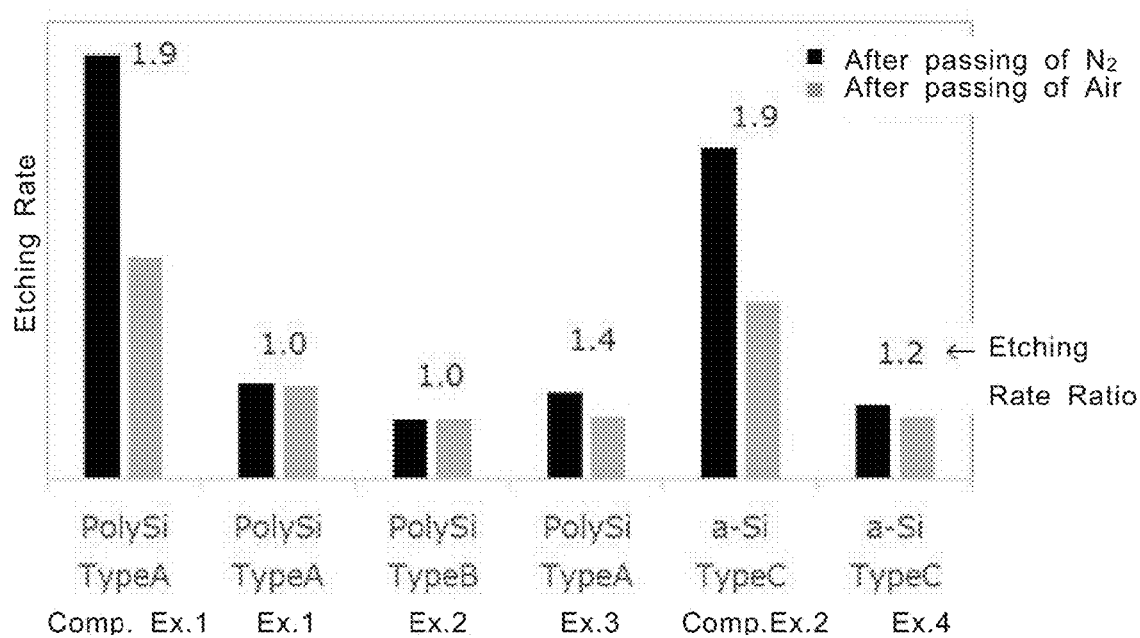
[Figure 2]
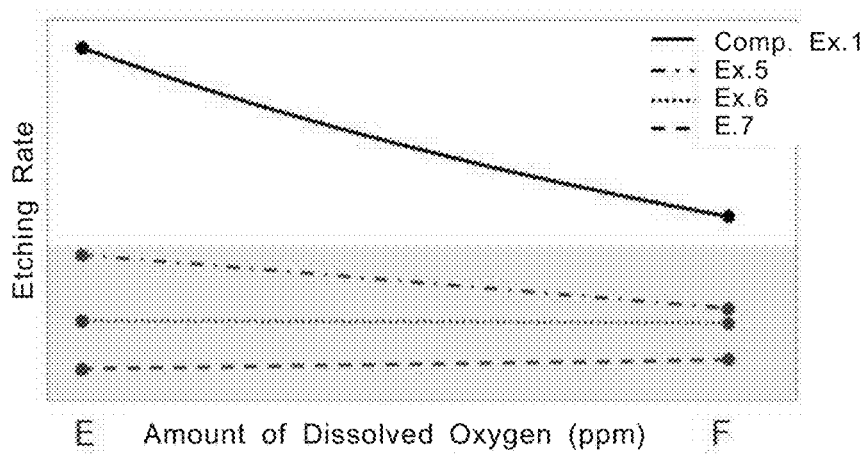

[Figure 3]
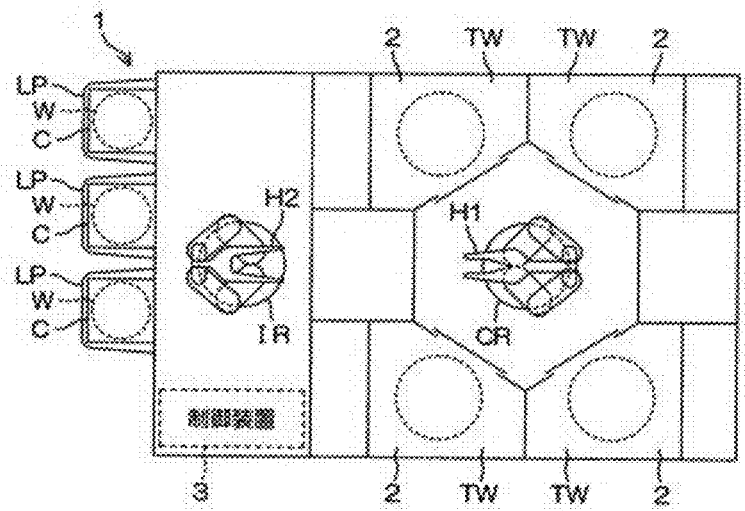
[Figure 4]
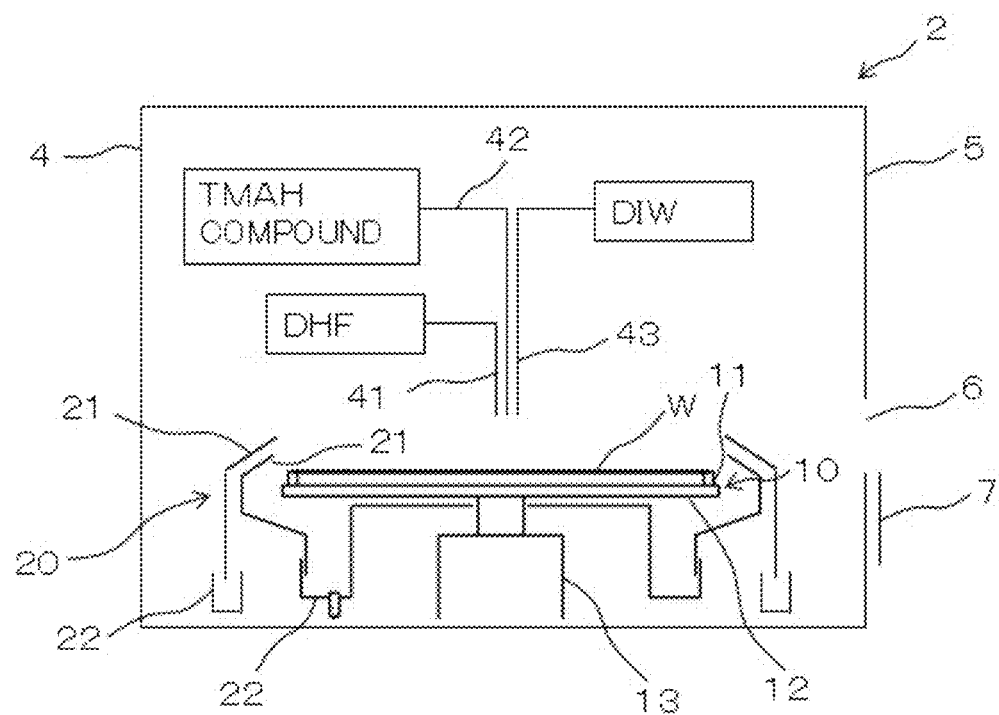

[Figure 5]
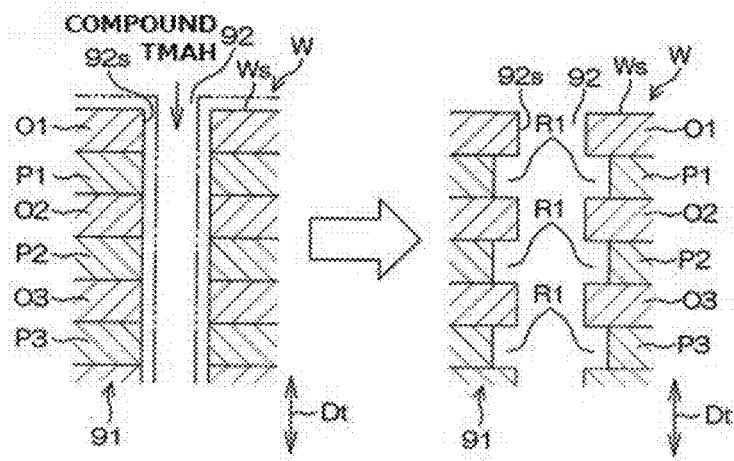
[Figure 6]
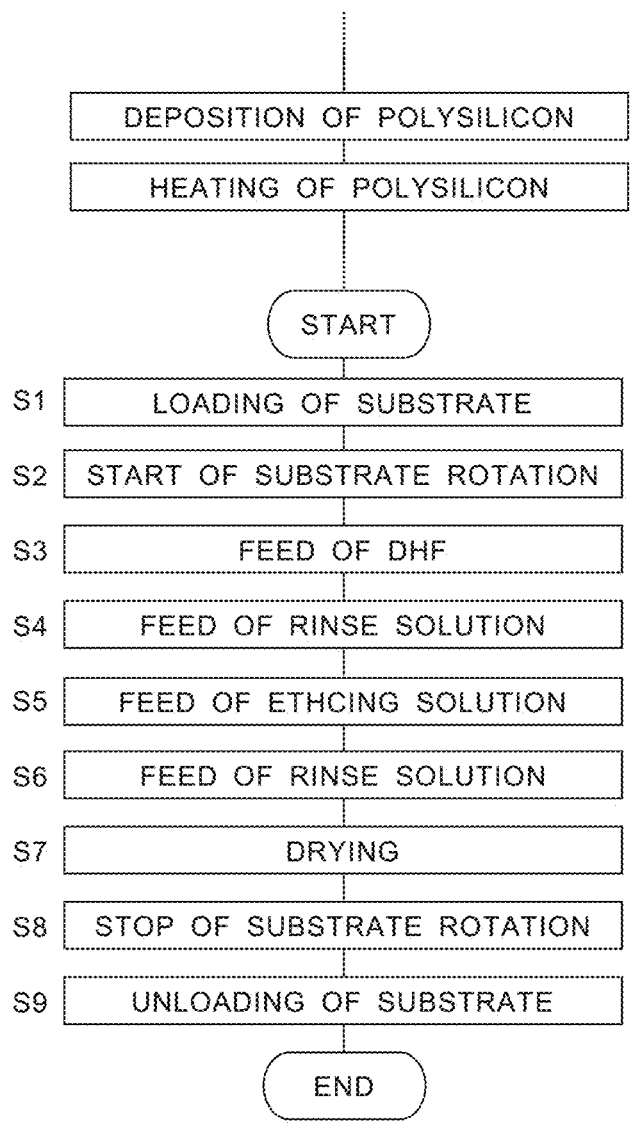

SILICON ETCHING SOLUTION AND METHOD FOR PRODUCING SILICON DEVICE USING THE ETCHING SOLUTION

This application claims priority to Japanese patent documents 2019-019215 filed on 5 Feb. 2019 and 2019-221269 filed on 6 Dec. 2019, both of which are incorporated herein by reference in their entireties.

TECHNICAL FIELD

The present invention relates to a silicon etching solution used in a surface processing or etching step in the production of various silicon devices. The present invention also relates to a method for producing a silicon device using the etching solution.

BACKGROUND OF THE INVENTION

In the production process for a semiconductor using silicon, alkali etching is sometimes used taking into consideration selectivity for a silicon oxide film and a silicon film. As alkalis, NaOH, KOH and tetramethyl ammonium hydroxide (also referred to as TMAH hereinafter) each of which has low toxicity and is easy to handle are used singly. Of these, TMAH has a lower etching rate for silicon oxide films than NaOH or KOH by about one digit, and hence TMAH is preferably used, particularly when a silicon oxide film that is inexpensive as compared with a silicon nitride film is used as a mask material.

Owing to multi-layerization of a memory cell and densification of a logic device in a semiconductor device, requirements for etching have become severe. In etching of silicon, silicon is oxidized by dissolved oxygen contained in a silicon etching solution, and with this, the etching rate decreases. Since the amount of oxidized silicon varies depending on the dissolved oxygen concentration, the degree of decrease in the etching rate also varies depending on the dissolved oxygen concentration. Variation of the etching rate due to the dissolved oxygen concentration of the silicon etching solution is brought about also by a circumferential direction of a substrate, a depth direction of a pattern, instrument error of an apparatus, environmental difference due to plant location, weather, etc., and there is a problem that uniform etching processing cannot be sometimes carried out.

In recent years, a step of silicon etching is frequently used in the semiconductor production process. An example of the step will be described taking a charge storage type memory as an example. As shown in FIG. 5, the charge storage type memory includes, for example, a substrate W having a laminated film 91 including a plurality of polysilicon films P1, P2, P3 and a plurality of silicon oxide films O1, O2, O3, and the production process thereof includes a step of etching the laminated film 91. In the etching, an etching solution is fed to a recessed portion 92 provided in the substrate W, thereby selectively etching the polysilicon films P1, P2, P3. The charge storage type memory works as a memory by storing a charge in the polysilicon films. The amount of the charge stored depends on the volumes of the polysilicon films. Therefore, in order to realize the designed capacity, the volumes of the polysilicon films need to be strictly controlled. However, if the etching rate varies depending on the dissolved oxygen concentration, as described above, the polysilicon films cannot be etched so as to have the designed volumes, and production of a device becomes difficult. In particular, the charge storage type memory has been multi-laminated in recent years, and the depth of a pattern reaches several micrometers. On that account, the dissolved oxygen concentration of the silicon etching solution at a layer in the vicinity of the wafer surface is different from that in the vicinity of a lower layer, so that it is difficult to carry out etching in the depth direction, as designed.

Then, in the step of etching that is influenced by oxygen, etching processing is carried out in an environment where the oxygen concentration has been adjusted by a processing apparatus or the like in which processing atmosphere concentration has been controlled.

In a step of removing a polymer (resist residue), a metal film on the substrate is oxidized by dissolved oxygen contained in a polymer removing solution, and the resulting metal oxide film is etched by the polymer removing solution, so that in order to prevent such a case, the processing is carried out using a chemical solution in which the amount of dissolved oxygen has been decreased by the use of a processing apparatus for adjusting the amount of dissolved oxygen contained in the chemical solution (Patent Literature 1).

In Patent Literature 2, as an etching solution for a silicon substrate for a solar cell, the solution containing an alkali hydroxide, water and a polyalkylene oxide alkyl ether, is disclosed. In Patent Literature 3, as an etching solution for a silicon substrate for a solar cell, the solution containing an alkali compound, an organic solvent, a surfactant and water, is disclosed. In Patent Literature 3, TMAH is given as an example of the alkali compound, and a polyalkylene oxide alkyl ether is given as an example of the organic solvent, but the alkali compounds actually used are sodium hydroxide and potassium hydroxide.

In Patent Literature 4, a developing solution containing a quaternary alkylammonium hydroxide, a nonionic surfactant and water is disclosed. As an example of the nonionic surfactant, a polyalkylene oxide alkyl ether is given, but actually, a nonionic surfactant having high surface activity, such as Surfynol (trade name) of an acetylene glycol-based surfactant, is used.

CITATION LIST

Patent Literature

[Patent Literature 1] Japanese Unexamined Patent Application Publication No. 2006-269668
[Patent Literature 2] Japanese Unexamined Patent Application Publication No. 2010-141139
[Patent Literature 3] Japanese Unexamined Patent Application Publication No. 2012-227304
[Patent Literature 4] WO 2017/169834

SUMMARY OF INVENTION

In the processing apparatus of Patent Literature 1, however, it is necessary to precisely control the oxygen concentration of the processing atmosphere and the dissolved oxygen concentration of the chemical solution in order to carry out uniform etching processing. On that account, precise adjustment of the processing apparatus and techniques therefor are necessary for carrying out the etching processing.

In the etching solutions of Patent Literature 2 and Patent Literature 3, NaOH and KOH are used as the alkali compounds, and therefore, the etching rate for the silicon oxide film is high. On this account, a mask material and a silicon oxide film that is a part of a pattern structure are also etched, and selective etching of a polysilicon film only cannot be carried out. The developing solution of Patent Literature 4 is not intended for precise etching of silicon, and therefore, influence of the dissolved oxygen in the etching solution is not taken into consideration at all. Moreover, the nonionic surfactant actually used is Surfynol or the like that has high surface activity, and it covers a surface of the polysilicon film and rather impairs etching of polysilicon, so that the polysilicon film cannot be etched with high accuracy.

Then, it is an object of the present invention to provide a silicon etching solution capable of suppressing influence of the amount of dissolved oxygen in the chemical solution and capable of carrying out uniform etching processing irrespective of the dissolved oxygen concentration. In a preferred embodiment of the present invention, it is an object to provide a method for adjusting the degree of influence of the dissolved oxygen concentration of the silicon etching solution on the etching rate by adjusting the compositional ratio of the silicon etching solution.

The present inventors have earnestly studied, and as a result, they have found that the above problem can be solved by adding a compound represented by the formula (1) to a silicon etching solution containing a quaternary alkylammonium hydroxide and water to contain.

That is to say, a first aspect of the present invention is a silicon etching solution that is a mixed solution comprising a quaternary alkylammonium hydroxide and water, and comprising a compound represented by the following formula (1):

$$R^1O-(C_mH_{2m}O)_n-R^2 \quad (1)$$

wherein $R^1$ is a hydrogen atom or an alkyl group having 1 to 3 carbon atoms, $R^2$ is a hydrogen atom or an alkyl group having 1 to 6 carbon atoms, m is an integer of 2 to 6, and n is 1 or 2.

In the first aspect of the present invention, it is preferable that a concentration of the quaternary alkylammonium hydroxide is 0.1 to 25 mass %, and a concentration of the compound represented by the formula (1) is 0.1 to 20 mass %.

In the first aspect of the present invention, it is more preferable that a concentration of the quaternary alkylammonium hydroxide is 0.5 to 25 mass %, and a concentration of the compound represented by the formula (1) is 0.1 to 20 mass %.

The silicon etching solution of the first aspect of the present invention preferably has an etching rate ratio of 0.5 to 1.5.

A second aspect of the present invention is a method for producing a silicon device, comprising a step of etching a silicon wafer, a polysilicon film or an amorphous silicon film, wherein the etching is carried out using the silicon etching solution of the first aspect of the present invention.

The etching rate ratio in the present invention is a ratio between etching rates of polysilicon by etching solutions having the same component compositions but having different dissolved oxygen concentrations, and is a ratio of an etching rate of an etching solution having a low dissolved oxygen concentration to an etching rate of an etching solution having a high dissolved oxygen concentration (etching rate in low dissolved oxygen concentration/etching rate in high dissolved oxygen concentration). An etching rate ratio close to "1" means that the etching rate is hardly influenced by the dissolved oxygen concentration.

According to the studies by the present inventors, it has been found that when a conventional silicon etching solution containing a quaternary alkylammonium hydroxide and water is allowed to contain a compound represented by the formula (1), a silicon etching rate decreases, but the degree of variation of the etching rate due to a difference in the dissolved oxygen concentration of the silicon etching solution is reduced as compared with that in the case of a silicon etching solution not containing the compound represented by the formula (1). When the dissolved oxygen concentration is high, the etching rate is low, and by incorporating the compound represented by the formula (1), the etching rate decreases. On the other hand, when the dissolved oxygen concentration is low, the etching rate is higher than that in the case of a high dissolved oxygen concentration, but by incorporating the compound represented by the formula (1), the etching rate greatly decreases. When the compound represented by the formula (1) is added to the etching solution having a high dissolved oxygen concentration, the ratio of decrease in the etching rate is small as compared with that in the case of a low dissolved oxygen concentration. That is to say, the etching rate ratio is lowered by adding the compound represented by the formula (1).

Accordingly, by adjusting the content of the compound represented by the formula (1), variation of the etching rate can be reduced (the etching rate ratio is in the vicinity of 1) even if the dissolved oxygen concentration of the silicon etching solution is high or even if it is low, and variation of the etching rate due to variation of the dissolved oxygen concentration of the silicon etching solution can be suppressed.

The etching rate of the silicon etching solution of the present invention is hardly influenced by the dissolved oxygen concentration, and irrespective of the dissolved oxygen concentration of the silicon etching solution, uniform etching processing becomes possible. On that account, the necessity of carrying out precise adjustment using a processing apparatus for adjusting an oxygen concentration of the processing atmosphere or the dissolved oxygen concentration of the chemical solution decreases. Moreover, even if variation of the dissolved oxygen concentration of the silicon etching solution is brought about by a circumferential direction of a substrate, a depth direction of a pattern, instrument error of an apparatus, environmental difference due to plant location, weather, etc., variation of the etching rate does not occur, and uniform etching processing is possible.

Furthermore, by adjusting the compositional ratio of the silicon etching solution, the degree of influence of the dissolved oxygen concentration on the etching rate of the silicon etching solution can be adjusted, and a silicon etching solution having a desired etching rate ratio can be prepared.

BRIEF DESCRIPTION OF DRAWINGS

FIG. 1 is a view showing an effect exerted by the addition of a compound represented by the formula (1) on a relationship between a dissolved oxygen concentration and an etching rate.

FIG. 2 is a view showing a relationship between an amount of dissolved oxygen and an etching rate, depending on a difference in a content of a compound represented by the formula (1).

FIG. 3 is a schematic top plan view of a substrate processing apparatus.

FIG. 4 is a schematic sectional view of a substrate processing unit.

FIG. 5 shows schematic sectional views of a substrate that is an etching object.

FIG. 6 is an example of an etching process flow.

DETAILED DESCRIPTION OF INVENTION

The silicon etching solution of the present invention is a mixed solution containing a quaternary alkylammonium hydroxide and water, and further contains a compound represented by the following formula (1):

wherein $R^1$ is a hydrogen atom or an alkyl group having 1 to 3 carbon atoms, $R^2$ is a hydrogen atom or an alkyl group having 1 to 6 carbon atoms, m is an integer of 2 to 6, and n is 1 or 2.

As the quaternary alkylammonium hydroxide, those used in a conventional silicon etching solution composed of a quaternary alkylammonium hydroxide aqueous solution can be used without any restriction. Examples thereof include tetramethylammonium hydroxide (TMAH), tetraethylammonium hydroxide (TEAH), ethyl trimethylammonium hydroxide (ETMAH), tetrapropylammonium hydroxide and tetrabutylammonium hydroxide. Of these quaternary alkylammonium hydroxides, preferable is a quaternary alkylammonium hydroxide in which the number of carbon atoms of an alkyl group is 1 to 4, and all of alkyl groups are the same as one another. It is most preferable to particularly use TMAH because the silicon etching rate is high. The concentration of the quaternary alkylammonium hydroxide does not particularly differ from that of a conventional silicon etching solution, and a concentration of 0.1 to 25 mass % is preferable because precipitation of crystal does not occur, and an excellent etching effect is obtained. The concentration of the quaternary alkylammonium hydroxide is more preferably in the range of 0.5 to 25 mass %.

The silicon etching solution of the present invention is characterized by containing a compound represented by the following formula (1).

In the formula (1), $R^1$ is a hydrogen atom or an alkyl group having 1 to 3 carbon atoms, $R^2$ is a hydrogen atom or an alkyl group having 1 to 6 carbon atoms, m is an integer of 2 to 6, and n is 1 or 2.

$R^1$ is preferably a hydrogen atom or a methyl group, $R^2$ is preferably a propyl group or a butyl group, and m is preferably 2 or 3.

Specific examples of the compounds represented by the formula (1), which are particularly preferably used in the present invention, include ethylene glycol monopropyl ether, ethylene glycol dimethyl ether, diethylene glycol monomethyl ether, diethylene glycol monoethyl ether, diethylene glycol dimethyl ether, diethylene glycol methyl ethyl ether, diethylene glycol diethyl ether, diethylene glycol monobutyl ether, propylene glycol monomethyl ether, propylene glycol monoethyl ether, propylene glycol monopropyl ether, propylene glycol dimethyl ether, dipropylene glycol monomethyl ether, dipropylene glycol monopropyl ether, and dipropylene glycol dimethyl ether. These compounds may be used singly, or may be used as a mixture of a plurality of different kinds.

Since the compound represented by the formula (1) is contained, it becomes possible to suppress influence of the dissolved oxygen concentration of the silicon etching solution, and even if the dissolved oxygen concentration is high or low, uniform etching processing is possible irrespective of the dissolved oxygen concentration. Moreover, by adjusting the content of the compound represented by the formula (1), a silicon etching solution that is influenced by the dissolved oxygen concentration as desired can be prepared.

The concentration of the compound represented by the formula (1) is preferably 20 mass % or less, more preferably less than 15 mass %, still more preferably 12 mass % or less, particularly preferably 10 mass % or less, based on the mass of the whole etching solution. The concentration of the compound represented by the formula (1) is preferably 0.1 mass % or more. When the concentration of the compound represented by the formula (1) is in the above range, a difference in etching rate due to influence of the dissolved oxygen concentration is reduced, and the etching rate is hardly influenced by a circumferential direction of a substrate, a depth direction of a pattern, instrument error of an apparatus, environmental difference due to plant location, weather, etc., so that uniform etching processing is possible.

The total concentration of the quaternary alkylammonium hydroxide and the compound represented by the formula (1) is preferably 45 mass % or less, more preferably 40 mass % or less, still more preferably 35 mass % or less, and the lower limit is preferably 0.2 mass % or more, more preferably 1.0 mass % or more. In addition to the quaternary alkylammonium hydroxide and the compound represented by the formula (1), a surfactant, etc. may be added to the silicon etching solution within limits not detrimental to the object of the present invention, but since these may exert influence on the etching ability, the amount thereof is preferably set to 1 mass % or less, and more preferably, they are not contained. Therefore, it is preferable that the portion of the silicon etching solution other than the quaternary alkylammonium hydroxide and the compound represented by the formula (1) is water.

The mechanism that the influence of the dissolved oxygen concentration of the silicon etching solution can be reduced by adding the compound represented by the formula (1) is not necessarily clear. However, the present inventors have considered as follows. The compound represented by the formula (1) can be thought to be a nonionic surfactant having a relatively low surface activity. The dissolved oxygen in the silicon etching solution reacts with a polysilicon surface, thereby forming an oxide film on the silicon surface. This oxide film functions as a mask material, and as a result, lowering of the etching rate for polysilicon is induced. On the other hand, the compound represented by the formula (1) has surface activity and adheres to the polysilicon surface to temporarily protect this surface. As a result, contact of the dissolved oxygen with the polysilicon surface is inhibited, and formation of an oxide film is suppressed. However, since the surface activity of the compound represented by the formula (1) is relatively low, this compound is detached from the polysilicon surface. As a result, the silicon etching solution comes into contact with the polysilicon surface, whereby etching is carried out. Adhesion and detachment of the compound represented by the formula (1) to the polysilicon surface are repeated, and during this time, etching slowly proceeds. It is thought that consequently the influence of the dissolved oxygen is reduced through the etching rate decreases.

On the other hand, if a nonionic surfactant having high surface activity is used instead of the compound represented by the formula (1), the surfactant firmly adheres to the polysilicon surface, whereby contact of the polysilicon surface with the etching solution is inhibited, and etching does not easily proceed.

Accordingly, the compound represented by the formula (1) preferably has appropriate hydrophilicity and hydrophobicity. For example, when m in the formula (1) is 4 or more, the compound tends to become hydrophobic. In this case, $R^1$ and $R^2$ are each preferably hydrogen from the viewpoint of a balance between hydrophilicity and hydrophobicity.

A preferred concentration of the compound represented by the formula (1) varies depending on the concentration of the quaternary alkylammonium hydroxide in the silicon etching solution and the temperature of the silicon etching solution. For example, in the case where the quaternary alkylammonium hydroxide is TMAH, the compound represented by the formula (1) is propylene glycol monopropyl ether, the solution temperature is 40° C., the TMAH concentration is 5 mass %, and the etching object substrate is a polysilicon substrate not having been doped, the concentration of the propylene glycol monopropyl ether is preferably 1 to 5 mass %, and in the case where the TMAH concentration is 10 mass %, the concentration of the propylene glycol monopropyl ether is preferably 4 to 10 mass %.

The etching rate ratio of the silicon etching solution of the present invention is preferably 0.5 to 1.5, more preferably 0.65 to 1.35, still more preferably 0.75 to 1.30. Since the etching rate ratio is in the above range, it becomes possible to suppress the influence of the dissolved oxygen concentration of the silicon etching solution on the etching rate, and irrespective of variation of the dissolved oxygen concentration attributed to a circumferential direction of a substrate, a depth direction of a pattern, instrument error of an apparatus, environmental difference due to plant location, weather, etc., the silicon etching rate is almost constant, so that uniform etching is possible.

The etching rate ratio is a ratio of an etching rate of a silicon etching solution having a low dissolved oxygen concentration to an etching rate of a silicon etching solution having a high dissolved oxygen concentration (etching rate of silicon etching solution having low dissolved oxygen concentration/etching rate of silicon etching solution having high dissolved oxygen concentration), at the solution temperatures during etching using silicon etching solutions that have the same component compositions and differ only in the dissolved oxygen concentration.

Regarding the etching rate ratio, a ratio ($R_N/R_A$) of an etching rate ($R_N$) in the dissolved oxygen concentration after degassing of dissolved oxygen by passing of $N_2$ (dissolved oxygen concentration is low) to an etching rate ($N_A$) in the saturated dissolved oxygen concentration after passing of air (dissolved oxygen concentration is high) is preferably in the above range.

Preferred conditions to determine the ratio ($R_N/R_A$) of an etching rate ($R_N$) in the dissolved oxygen concentration after degassing of dissolved oxygen by passing of $N_2$ to an etching rate ($N_A$) in the saturated dissolved oxygen concentration after passing of air are as follows.

The temperature during etching is a temperature at which etching is actually carried out.

Regarding the conditions of passing of $N_2$ into the silicon etching solution, a data table in which a flow rate of $N_2$ based on the amount of the silicon etching solution and a passing time have been determined in such a manner that the dissolved oxygen concentration decreases and becomes a constant concentration value is prepared, and on the basis of the data table, $N_2$ is passed to etching solution. Consequently, an etching solution substantially containing no dissolved oxygen is obtained.

Regarding the conditions of saturating the silicon etching solution with air, a data table in which a flow rate of air based on the amount of the silicon etching solution and a passing time have been determined in such a manner that the dissolved oxygen concentration increases and becomes a constant concentration value is prepared, and on the basis of the data table, air is passed into the silicon etching solution. Consequently, an etching solution in which the oxygen concentration is saturated is obtained.

Prior to measurement of the etching rate, an object substrate from which a natural oxide film has been removed is prepared, then this object substrate is immersed in the etching solution, and from a difference in film thickness between before and after the processing, the etching rate is calculated.

As can be seen from the examples, the ratio ($R_N/R_A$) of an etching rate ($R_N$) in the dissolved oxygen concentration of the silicon etching solution after passing of $N_2$ to an etching rate ($N_A$) in the saturated dissolved oxygen concentration thereof after passing of air is preferably 0.5 to 1.5.

The silicon etching solution of the present invention can be easily prepared by mixing a prescribed amount of the compound represented by the formula (1) with a quaternary alkylammonium hydroxide aqueous solution having a prescribed concentration to dissolve the compound. In this preparation, without directly mixing the compound represented by the formula (1), an aqueous solution of the compound represented by the formula (1) having a prescribed concentration may be prepared in advance and mixed.

The silicon etching solution of the present invention has merits of a quaternary alkylammonium hydroxide aqueous solution-based silicon etching solution, that is, low toxicity and easy handling, and has an advantage that an inexpensive silicon oxide film can be used as a mask material. Moreover, as compared with a conventional quaternary alkylammonium hydroxide-based silicon etching solution, the silicon etching solution of the present invention has small variation of etching rate for silicon even if the dissolved oxygen concentration of the solution varies. More specifically, the silicon etching solution of the present invention has a feature that when etching processing is carried out under the same conditions, this etching solution can suppress influence of variation of the dissolved oxygen concentration of the etching solution derived from the wafer circumferential direction, the pattern depth direction, the apparatus, the weather, etc. On this account, utilizing a wet etching technique for silicon, the silicon etching solution of the present invention can be preferably used as an etching solution in the production of various silicon devices, such as processing of a valve, a nozzle, a printer head and a semiconductor sensor for detecting various physical quantities such as flow rate, pressure and acceleration (e.g., diaphragm of semiconductor pressure sensor or cantilever of semiconductor acceleration sensor), and etching of a polysilicon film and an amorphous silicon film applied to various devices as a material of a part of metal wiring, a gate electrode or the like.

For producing a silicon device using the silicon etching solution of the present invention, wet etching of silicon may be carried out in accordance with a conventional method. The method used herein does not particularly differ from a method using a conventional silicon etching solution, and for example, the method can be preferably carried out by placing a "silicon wafer whose necessary portion is masked by a silicon oxide film, a silicon nitride film or the like" as a substance to be etched, in an etching tank containing the silicon etching solution, and dissolving an unnecessary portion of the silicon wafer utilizing chemical reaction with the silicon etching solution.

In a preferred embodiment of the present invention, the silicon etching solution is used in the production of a silicon device, including a step of selectively etching a polysilicon film by feeding the silicon etching solution to a recessed portion or a through hole of a laminate consisting of polysilicon films and silicon oxide films alternately laminated and having the recessed portion or the through hole penetrating a plurality of films is subjected to etching.

The temperature of the silicon etching solution during etching may be appropriately determined in the range of 20 to 95° C. taking into consideration a desired etching rate, a shape or surface condition of silicon after etching, productivity, etc., but is preferably set in the range of 30 to 60° C.

For the wet etching of silicon, the substance to be etched may be immersed in the silicon etching solution, but an electrochemical etching method in which a constant potential is applied to the substance to be etched can be adopted.

Examples of the objects of the etching processing in the present invention include silicon single crystal, polysilicon and amorphous silicon, and in the objects, silicon oxide films, silicon nitride films and metals such as aluminum that are not objects of the etching processing may be contained. Examples of such objects include a laminated structure in which a pattern-shaped silicon oxide film, silicon nitride film and further metal film are laminated on a silicon single crystal, a structure in which polysilicon or a resist is formed on or applied to the laminated structure, and a structure in which a metal portion such as aluminum is covered with a protective film and a silicon pattern is formed.

The embodiment of the present invention will be described in detail hereinafter with reference to the attached drawings.

FIG. 3 is a schematic top plan view of a substrate processing apparatus 1 according to the embodiment of the present invention.

As shown in FIG. 3, the substrate processing apparatus 1 is a single wafer type apparatus for processing a disc-shaped substrate W such as a semiconductor wafer one by one. The substrate processing apparatus 1 includes a load port LP for holding a carrier C storing the substrate W, a plurality of processing units 2 for processing the substrate W transported from the carrier C on the load port LP, transport robots for transporting the substrate W between the carrier C on the load port LP and the processing unit 2, and a control device 3 for controlling the substrate processing apparatus 1.

The transport robots include an indexer robot IR for carrying out loading and unloading of the substrate W at the carrier C on the load port LP and a center robot CR for carrying out loading and unloading of the substrate W at the plurality of processing units 2. The indexer robot IR transports the substrate W between the load port LP and the center robot CR, and the center robot CR transports the substrate W between the indexer robot IR and the processing unit 2. The center robot CR includes a hand H1 for supporting the substrate W, and the indexer robot IR includes a hand H2 for supporting the substrate W.

The plurality of processing units 2 form a plurality of towers TW arranged around the center robot CR in a plan view. Each of the towers TW includes a plurality (e.g., three) of processing units 2 vertically stacked. FIG. 3 shows an example in which four towers TW are formed. The center robot CR is accessible to any of the towers TW.

FIG. 4 is a schematic view of the inside of the processing unit 2 installed in the substrate processing apparatus 1, seen horizontally.

The processing unit 2 includes a box type chamber 4 having an internal space, a spin chuck 10 for rotating one substrate W around a vertical axis of rotation passing the center of the substrate W with holding the substrate W horizontally in the chamber 4, and a cylindrical processing cup 20 surrounding the spin chuck 10 around the axis of rotation.

The camber 4 includes a box type partition wall 5 provided with a loading/unloading port 6 through which the substrate W passes, and a shutter 7 for opening and closing the loading/unloading port 6.

The spin chuck 10 includes a disc-shaped spin base 12 held in a horizontal posture, a plurality of chuck pins 11 for holding the substrate W in a horizontal posture above the spin base 12, a spin shaft extending downward from the center of the spin base 12, and a spin motor 13 for rotating the spin shaft and thereby rotating the spin base 12 and the plurality of chuck pins 11. The spin chuck 10 is not limited to a clamp type chuck that brings the plurality of chuck pins 11 into contact with the outer peripheral surface of the substrate W, and may be a vacuum type chuck that allows the upper surface of the spin base 12 to adsorb the back surface (lower surface) of the substrate W, the back surface being a non-device formation surface, to thereby hold the substrate W horizontally.

The processing cup 20 includes a plurality of guards 21 for catching a liquid discharged outward from the substrate W, and a plurality of cups 22 for catching the liquid guided downward by the plurality of guards 21. FIG. 4 shows an example in which two guards 21 and two cups 22 are provided.

The processing unit 2 includes a guard lifting unit for lifting/lowering the plurality of guards 21 individually. The guard lifting unit positions the guard unit 21 at an arbitrary position between the upper position and the lower position. The guard lifting unit is controlled by the control device 3. The upper position is a position at which the upper end of the guard 21 is arranged above the holding position at which the substrate W is held by the spin chuck 10. The lower position is a position at which the upper end of the guard 21 is arranged below the holding position. The toric top end of a guard ceiling part corresponds to the upper end of the guard 21. The upper end of the guard 21 surrounds the substrate W and the spin base 12 in a plan view.

When the processing solution is fed to the substrate W in such a state that the spin chuck 10 rotates the substrate W, the processing solution fed to the substrate W is shaken off from the substrate W. When the processing solution is fed to the substrate W, the upper end of at least one guard 21 is arranged above the substrate W. Therefore, the processing solution discharged from the substrate W, such as a chemical solution or a rinse solution, is caught by any one of the guards 21, and is guided to the cup 22 corresponding to this guard 21

A plurality of solution discharge parts include a first chemical solution discharge part 41 for discharging a first chemical solution, a second chemical solution discharge part 42 for discharging a second chemical solution, and a rinse solution discharge part 43 for discharging a rinse solution. Further, a plurality of gas discharge parts for discharging inert gases may be installed. The plurality of solution discharge parts each have a valve for controlling solution discharge, and can start and stop of the solution discharge. The plurality of solution discharge parts each have a drive mechanism, and can be driven between the processing position at which the solution is discharged on the substrate and the waiting position located outside the substrate. The valve and the drive mechanism are controlled by the control device 3.

The first chemical solution is a solution containing at least one of chemical solutions capable of removing a natural oxide film on the substrate (e.g., hydrofluoric acid, buffered hydrofluoric acid, aqueous ammonia). In FIG. 4, the first chemical solution is represented by DHF.

The second chemical solution is a silicon etching solution of the present invention. In FIG. 4, the second chemical solution is represented by TMAH COMPOUND.

The rinse solution fed to the rinse solution discharge part 43 is pure water (deionized water). The rinse solution fed to the rinse solution discharge part 43 may be a rinse solution other than pure water. In FIG. 4, the rinse solution is represented by DIW.

FIG. 5 shows schematic views showing examples of a section of the substrate W before and after the processing shown in FIG. 6 is carried out.

The left-hand side of FIG. 5 shows a section of the substrate W before the processing (etching) shown in FIG. 6, and the right-hand side of FIG. 5 shows a section of the substrate W after the processing (etching) shown in FIG. 6. As shown by the right-hand side of FIG. 5, after the substrate W is subjected to etching, a plurality of recesses R1 recessed in the surface direction of the substrate W (direction orthogonal to the thickness direction Dt of the substrate W) are formed on the side surface 92s of the recessed portion 92.

As shown in FIG. 5, the substrate W includes a laminated film 91 formed on a base material such as a silicon wafer, and a recessed portion 92 recessed in the thickness direction Dt of the substrate W (direction orthogonal to the surface of the base material of the substrate W) from the outermost surface Ws of the substrate W. The laminated film 91 includes a plurality of polysilicon films P1, P2, P3 and a plurality of silicon oxide films O1, O2, O3. The polysilicon films P1 to P3 are examples of etching objects, and the silicon oxide films O1 to O3 are examples of non-etching objects. Silicon oxide is a substance insoluble or slightly soluble in an alkaline etching solution containing a quaternary alkylammonium hydroxide.

The plurality of polysilicon films P1 to P3 and the plurality of silicon oxide films O1 to O3 are laminated in the thickness direction Dt of the substrate W in such a manner that the positions of the polysilicon films and the silicon oxide films are alternately changed. The polysilicon films P1 to P3 are thin films obtained through a deposition step of depositing polysilicon on the substrate W and a heat treatment step of heating the deposited polysilicon (see FIG. 6). The polysilicon films P1 to P3 may be thins films not having been subjected to the heat treatment.

As shown in FIG. 5, the recessed portion 92 penetrates the plurality of polysilicon films P1 to P3 and the plurality of silicon oxide films O1 to O3 in the thickness direction Dt of the substrate W. The side surfaces of the polysilicon films P1 to P3 and the silicon oxide films O1 to O3 are exposed at the side surface 92s of the recessed portion 92. The recessed portion 92 may be any one of a trench, a via hole and a contact hole, or may be one other than these.

Before the processing (etching) shown in FIG. 6 is started, natural oxide films are formed on the surface layers of the polysilicon films P1 to P3 and the silicon oxide films O1 to O3. A long dashed double-dotted line on the left-hand side in FIG. 5 indicates an outline of the natural oxide films. A process in which the natural oxide films on the polysilicon films P1 to P3 and the silicon oxide films O1 to O3 are removed by feeding DHF that is an example of an oxide film removing solution and thereafter the polysilicon films P1 to P3 are selectively etched by feeding an etching solution will be described hereinafter.

FIG. 6 is a flow chart to describe an example of the processing of the substrate W carried out by the substrate processing apparatus 1.

Hereinafter, an example of the processing of the substrate W carried out by the substrate processing apparatus 1 will be described with reference to FIG. 3, FIG. 4 and FIG. 6. In the substrate processing apparatus 1, steps after the "start" in FIG. 6 are carried out.

For processing the substrate W by the substrate processing apparatus 1, a loading step of loading the substrate W into the chamber 4 is carried out (step S1 in FIG. 6).

Specifically, while all the guards 21 are located at the lower positions, the center robot CR enters the hand H1 into the chamber 4 with supporting the substrate W by the hand H1. Then, the center robot CR places the substrate W that is on the hand H1, onto the plurality of chuck pins 11 in such a state that the surface of the substrate W faces up. Thereafter, the plurality of chuck pins 11 are pressed against the outer peripheral surface of the substrate W to hold the substrate W. The center robot CR places the substrate W on the spin chuck 10 and then evacuates the hand H1 from the inside of the chamber 4.

Next, the spin motor 13 is driven, and rotation of the substrate W is started (step S2 in FIG. 6).

Next, a first chemical solution feed step of feeding DHF that is an example of the first chemical solution to the upper surface of the substrate W is carried out (step S3 in FIG. 6).

Specifically, a first chemical solution valve of the first chemical solution discharge part 41 is opened, and discharge of DHF is started. DHF discharged from the first chemical solution discharge part 41 collides with the center of the upper surface of the substrate W and then flows outward along the upper surface of the substrate W that is rotating. Consequently, a liquid film of DHF covering the whole upper surface of the substrate W is formed, and DHF is fed to the whole upper surface of the substrate W. When a prescribed period of time passes after the first chemical solution valve is opened, the first chemical solution valve is closed, and discharge of DHF is stopped.

Next, a first rinse solution feed step of feeding pure water that is an example of the rinse solution to the upper surface of the substrate W is carried out (step S4 in FIG. 6).

Specifically, a rinse solution valve of the rinse solution discharge part 43 is opened, and the rise solution discharge part 43 starts discharge of pure water. Pure water having been collided with the center of the upper surface of the substrate W flows outward along the upper surface of the substrate W that is rotating. DHF on the substrate W is washed away with the pure water discharged from the rinse solution discharge part 43. Consequently, a liquid film of pure water covering the whole upper surface of the substrate W is formed. When a prescribed period of time passes after the rinse solution valve is opened, the rinse solution valve is closed, and discharge of pure water is stopped.

Next, a second chemical solution feed step of feeding a silicon etching solution as the second chemical solution to the upper surface of the substrate W is carried out (step S5 in FIG. 6).

Specifically, a second chemical solution valve of the second chemical solution discharge part 42 is opened, and the second chemical solution discharge part 42 starts discharge of the etching solution. Before discharge of the etching solution is started, the guard lifting unit may move at least one guard 21 vertically in order to switch the guards 21 for catching a liquid discharged from the substrate W. The etching solution having been collided with the center of the upper surface of the substrate W flows outward along the upper surface of the substrate W that is rotating. The pure water on the substrate W is replaced with the etching solution discharged from the second chemical solution discharge part 42. Consequently, a liquid film of the etching solution covering the whole upper surface of the substrate W is formed. When a prescribed period of time passes after the second chemical solution valve is opened, the second chemical solution valve is closed, and discharge of the etching solution is stopped.

Next, a second rinse solution feed step of feeding pure water that is an example of the rinse solution to the upper surface of the substrate W is carried out (step S6 in FIG. 6).

Specifically, a rinse solution valve of the rinse solution discharge part 43 is opened, and the rinse solution discharge part 43 starts discharge of pure water. Pure water having been collided with the center of the upper surface of the substrate W flows outward along the upper surface of the substrate W that is rotating. The etching solution on the substrate W is washed away with the pure water discharged from the rinse solution discharge part 43. Consequently, a liquid film of pure water covering the whole upper surface of the substrate W is formed. When a prescribed period of time passes after the rinse solution valve is opened, the rinse solution valve is closed, and discharge of pure water is stopped.

Next, a drying step of drying the substrate W by the rotation of the substrate W is carried out (step S7 in FIG. 6).

Specifically, the spin motor 13 accelerates rotation of the substrate W in the rotational direction, and rotates the substrate W at a high rotational speed (e.g., several thousand rpm) that is higher than the rotational speed of the substrate W during the period from the first chemical solution feed step to the second rinse solution feed step. Consequently, any liquid is removed from the substrate W, and the substrate W is dried. When a prescribed period of time passes after the high-speed rotation of the substrate W is started, the spin motor stops rotating. Consequently, rotation of the substrate W is stopped (step S8 in FIG. 6).

Next, an unloading step of unloading the substrate W from the chamber 4 is carried out (step S9 in FIG. 6).

Specifically, the guard lifting unit lowers all the guard units 21 down to the lower positions. Thereafter, the center robot CR enters the hand H1 into the chamber 4. The plurality of chuck pins 11 release holding of the substrate W, and then the center robot CR supports the substrate W that is on the spin chuck 10, by the hand H1. Thereafter, the center robot CR evacuates the hand H1 from the inside of the chamber 4 with supporting the substrate W by the hand H1. Consequently, the processed substrate W is unloaded from the chamber 4.

In a preferred embodiment of the present invention, the aforesaid silicon etching solution is fed to the substrate W where the polysilicon films P1 to P3 (see FIG. 5) and the silicon oxide films O1 to O3 (see FIG. 5) that differ from the polysilicon films P1 to P3 are exposed, as described above.

In the present embodiment, DHF that is an example of the oxide film removing solution is fed to the substrate W, and natural oxide films on the polysilicon films P1 to P3 are removed from the surface layers of the polysilicon films P1 to P3. Thereafter, the etching solution is fed to the substrate W, and the polysilicon films P1 to P3 that are etching objects are selectively etched. The natural oxide films on the polysilicon films P1 to P3 are mainly composed of silicon oxide. The etching solution is a liquid that does not etch or hardly etches silicon oxide but etches the polysilicon films P1 to P3. The reason for this is that a hydroxide ion reacts with silicon but does not react or hardly reacts with silicon oxide.

Accordingly, by removing the natural oxide films on the polysilicon films P1 to P3 in advance, the polysilicon films P1 to P3 can be efficiently etched.

In the present embodiment, the etching rates of a silicon etching solution having a high dissolved oxygen concentration and a silicon etching solution having a low dissolved oxygen concentration can be made almost equal to each other (etching rate ratio is in the vicinity of 1), and variation of etching rate due to variation of the dissolved oxygen concentration of the silicon etching solution can be suppressed. On that account, uniform etching processing can be carried out on the substrate without being influenced by variation of the dissolved oxygen concentration caused by the difference of processing environment. On the other hand, if variation of etching rate due to variation of the dissolved oxygen concentration of the silicon etching solution cannot be suppressed, the widths of the recesses R1 formed by etching of the polysilicon films become ununiform, and the volumes of the remaining polysilicon films are also made ununiform. As a result, the designed volumes are not attained, and a desired device cannot be obtained.

In the present embodiment, the processing unit 2 may have a shield member arranged above the spin chuck 10. The shield member includes a disc part arranged above the spin chuck 10 and a cylinder part extending downward from the outer periphery of the disc part.

In the present embodiment, a single wafer type substrate processing apparatus for processing a substrate one by one is given as an example, but a batch type substrate processing apparatus for processing a plurality of substrates at once may be used.

EXAMPLES

The present invention will be described in more detail with reference to the following examples, but the present invention is in no way limited to those examples.

Example 1

As the silicon etching solution, a silicon etching solution having a composition shown in Table 1 was prepared using propylene glycol monopropyl ether as the compound represented by the formula (1).

Using the silicon etching solution prepared, a ratio ($R_N/R_A$) of an etching rate ($R_N$) after passing of $N_2$ at a solution temperature of 40° C. to an etching rate ($R_A$) after passing of air at the same solution temperature was measured assuming etching at a solution temperature of 40° C. In each of the examples and the comparative examples, the dissolved oxygen concentration of the silicon etching solution after passing of $N_2$ was 1 ppm or less, and the saturated dissolved oxygen concentration thereof after passing of air was 4 ppm or less.

For determining the etching rate ($R_N$) after passing of $N_2$, into the silicon etching solution having been heated to a solution temperature of 40° C., $N_2$ gas was passed by bubbling until the dissolved oxygen concentration decreased to a constant concentration value, and then a silicon substrate was immersed in the silicon etching solution obtained after passing of $N_2$, for 5 to 60 seconds, and a silicon etching rate at a solution temperature of 40° C. was measured. The dissolved oxygen concentration of the silicon etching solution was measured with a dissolved oxygen concentration meter. The object silicon substrate was a non-doped polysilicon substrate (PolySi TypeA) obtained by polysilicon film formation and was one from which a natural oxide film had been removed by a chemical solution. The etching rate was determined by measuring film thicknesses before etching and after etching with an ellipsometer and dividing a difference in polysilicon film thickness between before and after the processing by the etching time. The etching rate ($R_A$) after passing of air was determined in the same manner as in the measurement of the etching rate ($R_N$) after passing of $N_2$, except that air was used instead of $N_2$ gas, and bubbling was carried out until the dissolved oxygen concentration increased to a constant concentration value. A ratio ($R_N/R_A$) of the etching rate ($R_N$) after passing of $N_2$ to the etching rate ($R_A$) after passing of air was calculated.

Example 2

An etching rate ratio ($R_N/R_A$) was calculated in the same manner as in Example 1, except that a silicon etching solution having a composition shown in Table 1 was used as the silicon etching solution, and a polysilicon substrate (PolySi TypeB) obtained by polysilicon film formation was used as the object silicon substrate. The PolySi TypeA and the PolySi TypeB have films different from each other in the film thickness or obtained by different film forming conditions such as annealing conditions. The result is shown in Table 1 and FIG. 1.

Example 3

An etching rate ratio ($R_N/R_A$) was calculated in the same manner as in Example 1, except that a silicon etching solution having a composition shown in Table 1 was used as the silicon etching solution. The result is shown in Table 1 and FIG. 1.

Comparative Example 1

An etching rate ratio ($R_N/R_A$) was calculated in the same manner as in Example 1, except that a silicon etching solution not containing the compound represented by the formula (1) was used as the silicon etching solution. The result is shown in Table 1 and FIG. 1.

Example 4

An etching rate ratio ($R_N/R_A$) was calculated in the same manner as in Example 2, except that a polysilicon substrate (a-Si TypeC) obtained by amorphous silicon film formation was used as the object silicon substrate. The result is shown in Table 1 and FIG. 1.

Comparative Example 2

An etching rate ratio ($R_N/R_A$) was calculated in the same manner as in Comparative Example 1, except that a polysilicon substrate (a-Si TypeC) obtained by amorphous silicon film formation was used as the object silicon substrate. The result is shown in Table 1 and FIG. 1.

Examples 5 to 7, Comparative Example 1

Etching rate ratios ($R_N/R_A$) were calculated in the same manner as in Example 1, except that silicon etching solutions having compositions shown in Table 2 were each used as the silicon etching solution.

The results are shown in FIG. 2. The etching rate ratios were Comparative Example 1>1.5>Example 5>Example 6>Example 7>0.5. The etching rate ratios of the graphs in the gray area in FIG. 2 are each in the range of 0.5 to 1.5.

Examples 8 to 68, Comparative Example 3 to 9

Etching rate ratios ($R_N/R_A$) were calculated in the same manner as in Example 1, except that silicon etching solutions having compositions shown in Table 3 were each used as the silicon etching solution, and silicon substrates described in Table 1 were each used as the object silicon substrate. The results are shown in Table 3.

TABLE 1

| | Silicon etching solution | | | | | |
|---|---|---|---|---|---|---|
| | Main component | | Compound represented by formula (1) | | | |
| | Component | Content (mass %) | Component | Content (mass %) | Silicon substrate | Etching rate ratio |
| Ex. 1 | TMAH | 5 | propylene glycol monopropyl ether | X | poly Si TypeA | 1.0 |
| Ex. 2 | TMAH | 5 | propylene glycol monopropyl ether | Y | poly Si TypeB | 1.0 |
| Ex. 3 | TMAH | 5 | propylene glycol monomethyl ether | Z | poly Si TypeA | 1.4 |
| Comp. Ex. 1 | TMAH | 5 | — | — | poly Si TypeA | 1.9 |
| Ex. 4 | TMAH | 5 | propylene glycol monopropyl ether | Y | a-Si TypeC | 1.2 |
| Comp. Ex. 2 | TMAH | 5 | — | — | a-Si TypeC | 1.9 |

TABLE 2

| | Silicon etching solution | | | | |
|---|---|---|---|---|---|
| | Main component | | Compound represented by formula (1) | | |
| | Component | Content (mass %) | Component | Content (mass %) | Silicon substrate |
| Comp. Ex. 1 | TMAH | 5 | — | — | poly Si TypeA |
| Ex. 5 | TMAH | 5 | propylene glycol monopropyl ether | A | poly Si TypeA |
| Ex. 6 | TMAH | 5 | propylene glycol monopropyl ether | B | poly Si TypeA |

TABLE 2-continued

| | Silicon etching solution | | | | |
|---|---|---|---|---|---|
| | Main component | | Compound represented by formula (1) | | |
| | Component | Content (mass %) | Component | Content (mass %) | Silicon substrate |
| Ex. 7 | TMAH | 5 | propylene glycol monopropyl ether | C | poly Si TypeA |

TABLE 3

| | Silicon etching solution | | | | | |
|---|---|---|---|---|---|---|
| | Main component | | Compound represented by formula (1) | | | |
| | Component | Content (mass %) | Component | Content (mass %) | Silicon substrate | Etching rate ratio |
| Ex. 8 | TMAH | 0.05 | diethylene glycol monobutyl ether | 0.5 | poly Si TypeA | 1.48 |
| Ex. 9 | TMAH | 0.1 | ethylene glycol monopropyl ether | 0.05 | poly Si TypeB | 1.49 |
| Ex. 10 | TMAH | 0.1 | diethylene glycol monobutyl ether | 1 | poly Si TypeA | 1.18 |
| Ex. 11 | TMAH | 0.1 | diethylene glycol monomethyl ether | 1 | poly Si TypeA | 1.11 |
| ex. 12 | TMAH | 0.1 | diethylene glycol monomethyl ether | 1 | a-Si TypeC | 1.30 |
| Ex. 13 | TMAH | 0.1 | propylene glycol monomethyl ether | 1 | poly Si TypeA | 1.18 |
| Ex. 14 | TMAH | 0.1 | diethylene glycol monobutyl ether | 2 | poly Si TypeB | 0.85 |
| Ex. 15 | TMAH | 1 | dipropylene glycol monopropyl ether | 0.1 | poly Si TypeB | 0.77 |
| Ex. 16 | TMAH | 1 | dipropylene glycol monopropyl ether | 0.1 | a-Si TypeC | 0.86 |
| Ex. 17 | TMAH | 1 | dipropylene glycol monopropyl ether | 0.3 | poly Si TypeB | 0.76 |
| Ex. 18 | TMAH | 1 | ethylene glycol monopropyl ether | 1 | poly Si TypeB | 1.01 |
| Ex. 19 | TMAH | 1 | ethylene glycol monopropyl ether | 1 | a-Si TypeC | 1.21 |
| Ex. 20 | TMAH | 1 | diethylene glycol dimethyl ether | 1 | poly Si TypeB | 1.14 |
| Ex. 21 | TMAH | 1 | diethylene glycol monoethyl ether | 1 | poly Si TypeA | 1.15 |
| Ex. 22 | TMAH | 1 | ethylene glycol dimethyl ether | 3 | poly Si TypeB | 0.81 |
| Ex. 23 | TMAH | 1 | diethylene glycol dimethyl ether | 5 | poly Si TypeB | 0.81 |
| Ex. 24 | TMAH | 1 | diethylene glycol dimethyl ether | 5 | a-Si TypeC | 0.97 |
| Ex. 25 | TMAH | 3 | diethylene glycol methylethyl ether | 0.5 | poly Si TypeB | 0.84 |
| Ex. 26 | TMAH | 3 | dipropylene glycol dimethyl ether | 0.5 | poly Si TypeB | 0.92 |
| Ex. 27 | TMAH | 3 | dipropylene glycol dimethyl ether | 0.5 | a-Si TypeC | 1.10 |
| Ex. 28 | TMAH | 3 | propylene glycol monoethyl ether | 0.5 | poly Si TypeB | 1.26 |
| Ex. 29 | TMAH | 3 | diethylene glycol diethyl ether | 0.5 | poly Si TypeB | 0.88 |
| Ex. 30 | TMAH | 3 | diethylene glycol methylethyl ether | 2 | poly Si TypeB | 0.75 |
| Ex. 31 | TMAH | 3 | diethylene glycol methylethyl ether | 2 | a-Si TypeC | 0.85 |
| Ex. 32 | TMAH | 3 | dipropylene glycol dimethyl ether | 2 | poly Si TypeB | 0.81 |
| Ex. 33 | TMAH | 3 | propylene glycol monoethyl ether | 2 | poly Si TypeB | 0.85 |
| Ex. 34 | TMAH | 3 | diethylene glycol diethyl ether | 1 | poly Si TypeB | 0.78 |
| Ex. 35 | TMAH | 3 | diethylene glycol diethyl ether | 3 | a-Si TypeC | 0.81 |
| Ex. 36 | TMAH | 5 | propylene glycol monopropyl ether | 2 | poly Si TypeB | 0.84 |
| Ex. 37 | TMAH | 5 | diethylene glycol monomethyl ether | 2 | poly Si TypeA | 1.21 |
| Ex. 38 | TMAH | 5 | propylene glycol monomethyl ether | 2 | poly Si TypeA | 1.13 |
| Ex. 39 | TMAH | 5 | dipropylene glycol monomethyl ether | 3 | poly Si TypeA | 1.04 |
| Ex. 40 | TMAH | 5 | diethylene glycol monobutyl ether | 5 | poly Si TypeA | 0.87 |
| Ex. 41 | TMAH | 5 | diethylene glycol monobutyl ether | 5 | a-Si TypeC | 0.90 |
| Ex. 42 | TMAH | 5 | propylene glycol monopropyl ether | 5 | poly Si TypeB | 0.76 |
| Ex. 43 | TMAH | 5 | propylene glycol monomethyl ether | 5 | poly Si TypeA | 1.12 |
| Ex. 44 | TMAH | 5 | ethylene glycol dimethyl ether | 6 | poly Si TypeB | 0.86 |
| Ex. 45 | TMAH | 5 | diethylene glycol monoethyl ether | 6 | poly Si TypeA | 0.82 |
| Ex. 46 | TMAH | 5 | diethylene glycol monoethyl ether | 6 | a-Si TypeC | 1.01 |
| Ex. 47 | TMAH | 5 | dipropylene glycol monomethyl ether | 6 | poly Si TypeA | 0.95 |
| Ex. 48 | TMAH | 5 | dipropylene glycol monomethyl ether | 6 | a-Si TypeC | 0.96 |
| Ex. 49 | TMAH | 5 | ethylene glycol dimethyl ether | 10 | poly Si TypeB | 0.80 |
| Ex. 50 | TMAH | 5 | ethylene glycol dimethyl ether | 10 | a-Si TypeC | 0.98 |
| Ex. 51 | TMAH | 5 | diethylene glycol monoethyl ether | 10 | poly Si TypeA | 0.77 |
| Ex. 52 | TMAH | 10 | dipropylene glycol dimethyl ether | 2 | poly Si TypeB | 0.91 |
| Ex. 53 | TMAH | 10 | dipropylene glycol monopropyl ether | 2 | poly Si TypeB | 1.11 |
| Ex. 54 | TMAH | 10 | dipropylene glycol monomethyl ether | 4 | poly Si TypeA | 1.30 |
| Ex. 55 | TMAH | 10 | propylene glycol monoethyl ether | 4 | poly Si TypeB | 0.86 |
| Ex. 56 | TMAH | 10 | propylene glycol monoethyl ether | 4 | a-Si TypeC | 0.95 |
| Ex. 57 | TMAH | 10 | propylene glycol monopropyl ether | 4 | poly Si TypeA | 0.99 |
| Ex. 58 | TMAH | 10 | propylene glycol monopropyl ether | 4 | a-Si TypeC | 1.19 |
| Ex. 59 | TMAH | 10 | dipropylene glycol dimethyl ether | 5 | poly Si TypeB | 0.87 |
| Ex. 60 | TMAH | 10 | diethylene glycol dimethyl ether | 12 | poly Si TypeB | 0.80 |
| Ex. 61 | TMAH | 10 | dipropylene glycol monomethyl ether | 10 | poly Si TypeA | 0.88 |
| Ex. 62 | TMAH | 10 | propylene glycol monopropyl ether | 10 | poly Si TypeA | 1.12 |
| Ex. 63 | TMAH | 15 | diethylene glycol monomethyl ether | 10 | poly Si TypeA | 1.12 |
| Ex. 64 | TMAH | 25 | propylene glycol monomethyl ether | 10 | poly Si TypeA | 1.19 |
| Ex. 65 | TMAH | 25 | propylene glycol monomethyl ether | 10 | a-Si TypeC | 1.30 |

TABLE 3-continued

| | Main component | | Compound represented by formula (1) | | Silicon substrate | Etching rate ratio |
|---|---|---|---|---|---|---|
| | Component | Content (mass %) | Component | Content (mass %) | | |
| Ex. 66 | ETMAH | 3 | diethylene glycol monobutyl ether | 20 | poly Si TypeB | 0.72 |
| Ex. 67 | ETMAH | 3 | dipropylene glycol monomethyl ether | 20 | poly Si TypeB | 0.59 |
| Ex. 68 | TEAH | 5 | dipropylene glycol monomethyl ether | 3 | poly Si TypeB | 0.86 |
| Comp. Ex. 3 | TMAH | 0.1 | none | 0 | poly Si TypeA | 3.20 |
| Comp. Ex. 4 | TMAH | 0.1 | none | 0 | poly Si TypeB | 2.06 |
| Comp. Ex. 5 | TMAH | 1 | none | 0 | poly Si TypeB | 2.19 |
| Comp. Ex. 6 | TMAH | 3 | none | 0 | poly Si TypeB | 2.17 |
| Comp. Ex. 7 | TMAH | 5 | none | 0 | poly Si TypeB | 1.64 |
| Comp. Ex. 8 | TMAH | 10 | none | 0 | poly Si TypeB | 1.62 |
| Comp. Ex. 9 | TMAH | 25 | none | 0 | poly Si TypeA | 2.10 |

In Table 1 and Table 2, X, Y and Z satisfy $0.1 \leq X < Y < Z \leq 20$ (mass %), and A, B and C satisfy $0.1 \leq A < B < C \leq 20$ (mass %).

REFERENCE SIGNS LIST 1 substrate processing apparatus
2 processing unit
3 control device
4 chamber
10 spin chuck
11 chuck pin
12 spin base
13 spin motor
20 processing cup
21 guard
22 cup
41 first chemical solution discharge part
42 second chemical solution discharge part
43 rinse solution discharge part
91 laminated film
92 recessed portion
R1 recess
P1, P2, P3 polysilicon film
O1, O2, O3 silicon oxide film
LP load port
IR indexer robot
CR center robot
H1 (H2) hand

The invention claimed is:

1. A silicon etching solution that is a mixed solution consisting essentially of a quaternary alkylammonium hydroxide, water and a compound represented by the following formula (1):

$$R^1O—(C_mH_{2m}O)_n—R^2 \qquad (1)$$

wherein $R^1$ is a hydrogen atom or an alkyl group having 1 to 3 carbon atoms, $R^2$ is an alkyl group having 1 to 6 carbon atoms, m is an integer of 2 to 6, and n is 1 or 2,
wherein a concentration of the quaternary alkylammonium hydroxide is 0.05 to 10 mass %, and a concentration of the compound represented by the formula (1) is 0.1 to 3 mass %.

2. The silicon etching solution according to claim 1, wherein the quaternary alkylammonium hydroxide is tetramethyl ammonium hydroxide.

3. The silicon etching solution according to claim 1, wherein the compound represented by formula (1) is ethylene glycol monopropyl ether, propylene glycol monoethyl ether, propylene glycol monopropyl ether, or dipropylene glycol dimethyl ether.

4. An etching method, comprising:
providing the silicon etching solution according to claim 1; and
etching a silicon wafer, a polysilicon film or an amorphous silicon film with said silicon etching solution irrespective of a dissolved oxygen concentration in said silicon etching solution.

5. An etching method, comprising:
providing the silicon etching solution according to claim 1; and
etching a silicon wafer, a polysilicon film or an amorphous silicon film with said silicon etching solution to thereby lowering an etching rate ratio which is a ratio $(R_N/R_A)$ of an etching rate $(R_N)$ in which a silicon etching solution is degassed of dissolved oxygen to an etching rate $(N_A)$ in which a silicon etching solution is saturated with dissolved oxygen.

6. A method for producing a silicon device, comprising:
providing the silicon etching solution according to claim 1; and
etching a silicon wafer, a polysilicon film or an amorphous silicon film with said silicon etching solution.

7. A silicon etching solution that is a mixed solution comprising a quaternary alkylammonium hydroxide, water and a compound represented by the following formula (1):

$$R^1O—(C_mH_{2m}O)_n—R^2 \qquad (1)$$

wherein $R^1$ is a hydrogen atom or an alkyl group having 1 to 3 carbon atoms, $R^2$ is an alkyl group having 1 to 6 carbon atoms, m is an integer of 2 to 6, and n is 1 or 2,
wherein a concentration of the quaternary alkylammonium hydroxide is 0.05 to 10 mass %, and a concentration of the compound represented by the formula (1) is 0.1 to 3 mass %, and
wherein the etching solution does not contain a surfactant.

8. A silicon etching solution that is a mixed solution consisting of a quaternary alkylammonium hydroxide, water and a compound represented by the following formula (1):

$$R^1O—(C_mH_{2m}O)_n—R^2 \qquad (1)$$

wherein $R^1$ is a hydrogen atom or an alkyl group having 1 to 3 carbon atoms, $R^2$ is an alkyl group having 1 to 6 carbon atoms, m is an integer of 2 to 6, and n is 1 or 2,
wherein a concentration of the quaternary alkylammonium hydroxide is 0.05 to 10 mass %, and a concentration of the compound represented by the formula (1) is 0.1 to 3 mass %.

* * * * *